US012641984B2

(12) United States Patent     (10) Patent No.: US 12,641,984 B2
Ren et al.     (45) Date of Patent: May 26, 2026

(54) DISPLAY PANEL HAVING LIGHT-REFLECTING LAYER, MANUFACTURING METHOD THEREOF, AND ELECTRONIC DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Xuechao Ren, Shenzhen (CN); Shijian Qin, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 1110 days.

(21) Appl. No.: 17/753,740

(22) PCT Filed: Feb. 23, 2022

(86) PCT No.: PCT/CN2022/077495
§ 371 (c)(1),
(2) Date: Aug. 24, 2023

(87) PCT Pub. No.: WO2023/155223
PCT Pub. Date: Aug. 24, 2023

(65) Prior Publication Data
US 2024/0057454 A1     Feb. 15, 2024

(30) Foreign Application Priority Data
Feb. 16, 2022    (CN) ......................... 202210140633.7

(51) Int. Cl.
*H10K 59/80* (2023.01)
*H10K 59/122* (2023.01)
(Continued)

(52) U.S. Cl.
CPC ......... *H10K 59/878* (2023.02); *H10K 59/122* (2023.02); *H10K 59/8792* (2023.02); *H10K 71/13* (2023.02); *H10K 71/20* (2023.02)

(58) Field of Classification Search
None
See application file for complete search history.

(56) References Cited

U.S. PATENT DOCUMENTS

2009/0322210 A1* 12/2009 Yokoo .................. H10K 59/173
                               313/504
2019/0058147 A1* 2/2019 Liu .................... H10H 20/8506
(Continued)

FOREIGN PATENT DOCUMENTS

CN    106941113 A    7/2017
CN    108461651 A    8/2018
(Continued)

OTHER PUBLICATIONS

International Search Report in International application No. PCT/CN2022/077495, mailed on May 30, 2022.
(Continued)

*Primary Examiner* — Nduka E Ojeh
(74) *Attorney, Agent, or Firm* — PV IP PC; Peter Stecher; Wei Te Chung

(57) ABSTRACT

A display panel, a manufacturing method thereof, and an electronic device are provided. The display panel includes a substrate, first electrodes, a pixel definition layer, light-emitting layers, and light-reflecting layers. In the present application, light-reflecting layers are provided in one of the pixel openings, the light-reflecting layer can reflect the light
(Continued)

emitted by the light-emitting layers to the pixel definition layer so that the light emitted by the light-emitting layers is concentrated in the middle, which improves the light utilization rate of the light-emitting layers. Therefore, the technical problem of low luminous utilization efficiency of light-emitting pixels in the current OLED structure is alleviated.

14 Claims, 2 Drawing Sheets

(51) Int. Cl.
H10K 71/13 (2023.01)
H10K 71/20 (2023.01)

(56) References Cited

U.S. PATENT DOCUMENTS

| | | | |
|---|---|---|---|
| 2019/0237521 A1 | 8/2019 | Ju | |
| 2020/0194524 A1* | 6/2020 | Ding | H10K 59/123 |
| 2021/0028403 A1* | 1/2021 | Jia | H10K 59/122 |
| 2021/0335939 A1* | 10/2021 | Li | H10K 59/878 |
| 2022/0050239 A1* | 2/2022 | Fattal | G02B 6/0025 |
| 2023/0157080 A1* | 5/2023 | Chen | H10K 59/1201 257/40 |
| 2023/0214047 A1* | 7/2023 | Han | H10K 59/124 345/174 |
| 2024/0107813 A1* | 3/2024 | He | H10K 59/122 |

FOREIGN PATENT DOCUMENTS

| | | |
|---|---|---|
| CN | 110767724 A | 2/2020 |
| CN | 111261665 A | 6/2020 |
| CN | 112599697 A | 4/2021 |
| CN | 213071143 U | 4/2021 |
| CN | 113053967 A | 6/2021 |
| CN | 113871549 A | 12/2021 |

OTHER PUBLICATIONS

Written Opinion of the International Search Authority in International application No. PCT/CN2022/077495,mailed on May 30, 2022.

Chinese Office Action issued in corresponding Chinese Patent Application No. 202210140633.7 dated Dec. 29, 2022, pp. 1-7.

* cited by examiner

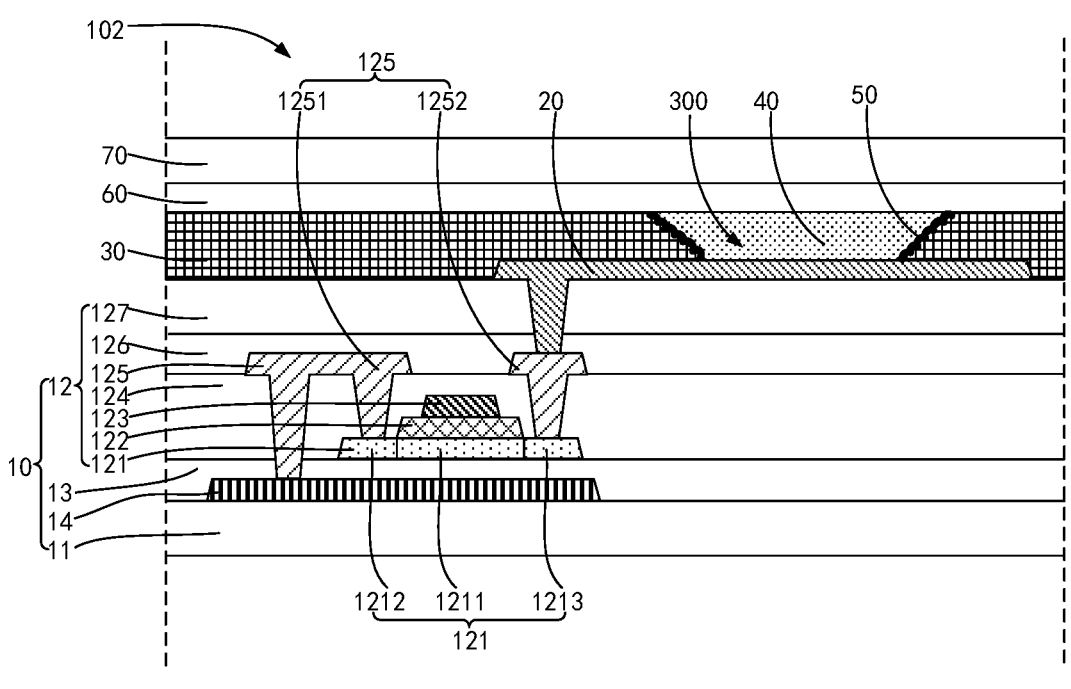

FIG. 3

Providing a substrate and forming a first electrode on the substrate; — S301

Forming a pixel definition layer on the first electrode and the substrate, and patterning the pixel definition layer to define pixel openings, wherein each of the pixel openings exposes a portion of the first electrode; and — S302

Forming a light-emitting layer and a light-reflecting layer in the pixel openings, wherein the light-reflecting layer covers a first surface of the pixel definition layer in the pixel openings and is located between the pixel definition layer and the light-emitting layer. — S303

FIG. 4

DISPLAY PANEL HAVING LIGHT-REFLECTING LAYER, MANUFACTURING METHOD THEREOF, AND ELECTRONIC DEVICE

FIELD OF INVENTION

The present application relates to a field of display technology, and particularly relates to a display panel, a manufacturing method thereof, and an electronic device.

BACKGROUND OF INVENTION

In a current structure of an organic light-emitting diode (OLED) display device, only the light in a direction perpendicular to electrodes in OLED light-emitting pixels can be effectively utilized. The light in a non-vertical direction is absorbed by organic materials such as pixel banks (Banks), resulting in low luminous efficiency, and the converted thermal energy may affect the device's stability.

Technical Problem

The present application provides a display panel, a manufacturing method thereof, and an electronic device to alleviate a technical problem of low luminous utilization efficiency of light-emitting pixels in the current OLED structure.

SUMMARY OF INVENTION

In order to solve the aforesaid problems, the technical solutions provided by the present application are as follows: Embodiments of the present application provide a display panel, which includes: a substrate; first electrodes arranged in an array and disposed on the substrate; a pixel definition layer covering the first electrodes and the substrate, wherein the pixel definition layer is defined with pixel openings, and each pixel opening exposes a portion of one of the first electrodes; light-emitting layers disposed in the pixel openings and covering the first electrodes; and light-reflecting layers disposed on a first surface of the pixel definition layer in one of the pixel openings and located between the pixel definition layer and one of the light-emitting layers.

In the display panel provided by an embodiment of the present application, a material of the light-reflecting layers includes a metal-polymer nanocomposite.

In the display panel provided by an embodiment of the present application, a material of the light-reflecting layers includes silver or chromium.

In the display panel provided by an embodiment of the present application, the light-reflecting layers have a convex-concave microstructure.

In the display panel provided by an embodiment of the present application, an angle included between the first surface and the first electrode exposed by one of the pixel openings is greater than 90 degrees.

In the display panel provided by an embodiment of the present application, the substrate includes: a base; a light-shielding layer disposed on the base; and a driving circuit layer disposed on a side of the light-shielding layer away from the base and including an active layer, a gate insulating layer, a gate, an interlayer insulating layer, and a source/drain layer arranged in a stack, wherein the source/drain layer includes a source and a drain, and the source or the drain is connected to the light-shielding layer.

An embodiment of the present application further provides a manufacturing method of a display panel, including: providing a substrate and forming first electrodes on the substrate; forming a pixel definition layer on the first electrodes and the substrate, and patterning the pixel definition layer to define pixel openings, wherein each of the pixel openings exposes a portion of one of the first electrodes; forming light-emitting layers and light-reflecting layers in the pixel openings, wherein each light-reflecting layer covers a first surface of the pixel definition layer in one of the pixel openings and is located between the pixel definition layer and one of the light-emitting layers.

In the manufacturing method of the display panel provided by an embodiment of the present application, the step of forming the light-emitting layers and the light-reflecting layers in the pixel openings includes: dissolving a metal-polymer nanocomposite and a luminescent material in an organic solvent to form an ink; printing the ink within the pixel openings; drying the ink in the pixel openings to cause the luminescent material to form the light-emitting layers and cause the metal-polymer nanocomposite to attach to the first surfaces of the pixel definition layer in the pixel openings to form the light-reflecting layers.

In the manufacturing method of the display panel provided by an embodiment of the present application, the step of forming the light-emitting layers and the light-reflecting layers in the pixel openings includes: modifying a surface of the pixel definition layer in one of the pixel openings to form a convex-concave microstructure as one of the light-reflecting layers; dissolving a luminescent material in an organic solvent to form an ink; and forming the light-emitting layer by printing the ink in the pixel openings.

In the manufacturing method of the display panel provided by an embodiment of the present application, the ways of performing surface modification on the surface of the pixel definition layer in one of the pixel openings include plasma surface flocking, plasma ion implantation, or surface roughness improvement.

In the manufacturing method of the display panel provided by an embodiment of the present application, the step of forming the light-emitting layers and the light-reflecting layers in the pixel openings includes: coating a layer of silver or chromium metal film on the surface of the pixel definition layer in one of the pixel openings as one of the light-reflecting layers; dissolving a luminescent material in an organic solvent to form an ink; and forming the light-emitting layers by printing the ink in the pixel openings.

An embodiment of the present application further provides an electronic device including the display panel of one of the foregoing embodiments.

Beneficial Effect

In the display panel, the manufacturing method thereof, and the electronic device provided by the present application, the display panel includes a substrate, first electrodes, a pixel definition layer, light-emitting layers, and light-reflecting layers. The first electrodes are arranged in an array and disposed on the substrate. The pixel definition layer covers the first electrodes and the substrate, wherein the pixel definition layer is defined with pixel openings, and each pixel opening exposes a portion of one of the first electrodes. The light-emitting layers are disposed in the pixel openings and covering the first electrodes. The light-reflecting layers are disposed on a first surface of the pixel definition layer in one of the pixel openings and located between the pixel definition layer and one of the light-emitting layers. In the present application, the light-reflecting layers are provided in one of the pixel openings, the light-reflecting layers can reflect the light emitted from the light-emitting layers to the pixel definition layer so that the light emitted by the light-emitting layers is concentrated in the middle, which improves the light utilization rate of the light-emitting layers. Therefore, the technical problem of low luminous utilization efficiency of light-emitting pixels in the current OLED structure is solved.

DESCRIPTION OF DRAWINGS

In order to illustrate the embodiments or technical solutions in the prior art more clearly, the following briefly introduces the drawings that need to be used in the description of the embodiments or the prior art. Obviously, the drawings in the description are only some embodiments of the invention, and for one skill in the art, other drawings can also be obtained from these drawings without paying creative effort.

FIG. 3 is still another schematic cross-sectional view of a display panel provided by an embodiment of the present application.

FIG. 4 is a schematic flowchart of a manufacturing method of a display panel according to an embodiment of the present application.

DETAILED DESCRIPTION OF PREFERRED EMBODIMENTS

Figure 1:
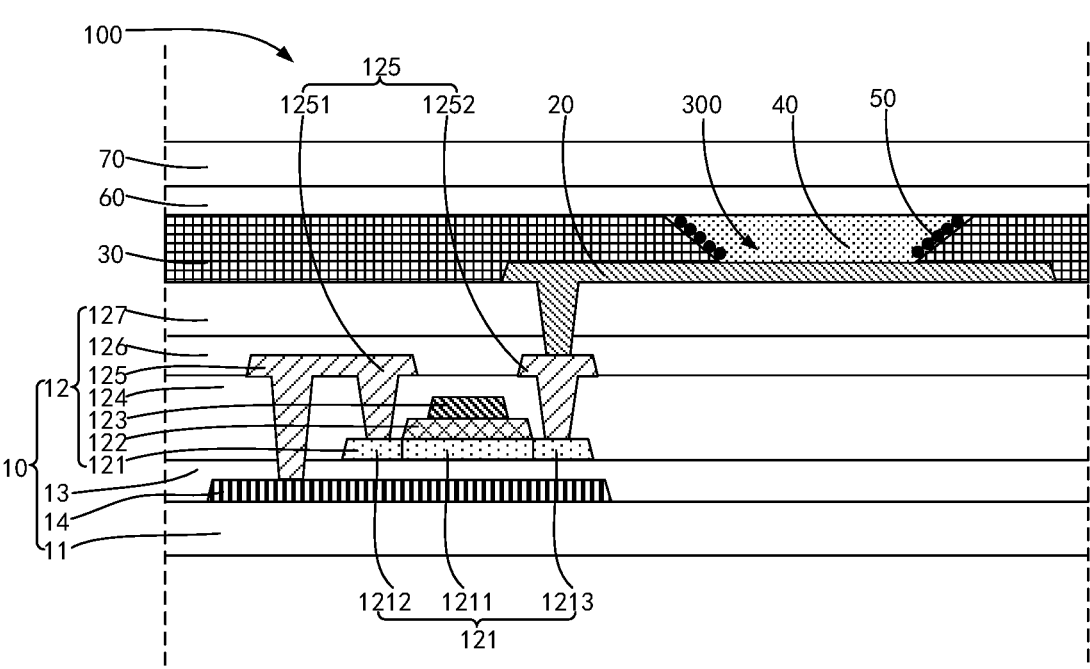
FIG. 1 is a schematic cross-sectional view of a display panel according to an embodiment of the present application.

The following descriptions of the embodiments refer to the accompanying drawings to illustrate specific embodiments in which the present application may be practiced. Directional terms mentioned in the present application, such as "above", "below", "front", "rear", "left", "right", "inner", "outer", "side", etc., are only references to the directions of the attached drawings. Therefore, the directional terms are used to describe and understand the present application, rather than to limit the present application. In the drawings, structurally similar elements are denoted by the same reference numerals. In the drawings, the thicknesses of some layers and regions are exaggerated for clarity of understanding and ease of description. That is, the size and thickness of each component shown in the drawings are arbitrarily shown, but the present application is not limited thereto.

Please refer to FIG. 1, which is a schematic cross-sectional view of a display panel according to an embodiment of the present application. The display panel 100 includes a substrate 10, first electrodes 20, a pixel definition layer 30, a light-emitting layer 40, and a light-reflecting layer 50. The first electrodes 20 are arranged in an array and disposed on the substrate 10. The pixel definition layer 30 covers the first electrode 20 and the substrate 10, wherein the pixel definition layer is defined with pixel openings 300, and each pixel opening 300 exposes a portion of one of the first electrodes 20. The light-emitting layer 40 is disposed in the pixel opening 300 and covers the first electrode 20. The light-reflecting layer 50 is disposed on the first surface of the pixel definition layer 30 in the pixel opening 300 and is located between the pixel definition layer 30 and the light-emitting layer 40.

In detail, the substrate 10 includes a base 11 and a driving circuit layer 12 disposed on the base 11. Optionally, a buffer layer 13 may be further disposed between the base 11 and the driving circuit layer 12, and the material of the buffer layer 13 may include silicon oxide ($SiO_x$), silicon nitride ($SiN_x$), silicon oxynitride (SiON), and other inorganic materials. The buffer layer 13 can further prevent undesired impurities or contaminants (e.g., moisture, oxygen, etc.) from diffusing from the base 11 into devices that may be damaged by these impurities or contaminants while providing a top flat surface.

Optionally, the substrate 11 can be a rigid substrate or a flexible substrate. When the substrate 11 is a rigid substrate, it may include a rigid substrate such as a glass substrate. When the substrate 11 is a flexible substrate, it may include flexible substrates such as polyimide (PI) film, ultra-thin glass film, etc. A flexible display panel can be manufactured by using a flexible substrate as the substrate 11 to achieve special properties such as bending and curling of the display panel.

The driving circuit layer 12 includes an active layer 121, a gate insulating layer 122, a gate 123, an interlayer insulating layer 124, a source/drain layer 125, a passivation layer 126, and a planarization layer 127. The active layer 121 includes a channel region 1211 and a source region 1212 and a drain region 1213 located on both sides of the channel region 1211. The gate insulating layer 122 covers the active layer 121 and is disposed corresponding to the channel region 1211. The gate 123 is disposed on the gate insulating layer 122 corresponding to the channel region 1211.

Optionally, the substrate 10 further includes a light-shielding layer 14 disposed on the base 11, and the buffer layer 13 covers the light-shielding layer 14 and the base 11. The light-shielding layer 14 is disposed corresponding to the active layer 121 so that the orthographic projection of the active layer 121 on the base 11 falls within the orthographic projection range of the light-shielding layer 14 on the base 11. That is, the light-shielding layer 14 can completely shield the active layer 121 to prevent light from irradiating the active layer 121.

The interlayer insulating layer 124 covers the gate 123 and the buffer layer 13. The source/drain layer 125 is disposed on the interlayer insulating layer 124 and is patterned to form a source 1251, a drain 1252, etc. The source 1251 is connected to the source region 1212 through the via hole of the interlayer insulating layer 124, and the drain 1252 is connected to the drain region 1213 through another via hole of the interlayer insulating layer 124. Optionally, the source 1251 is also connected to the light-shielding layer 14 through still another via hole of the interlayer insulating layer 124.

The passivation layer 126 covers the source/drain layer 125 and the interlayer insulating layer 124, and the planarization layer 127 covers the passivation layer 126. The arrangement of the planarization layer 127 can provide a flat film surface for the substrate 10.

It should be noted that the structure of the driving circuit layer 12 in the present application is not limited to the one illustrated in this embodiment. The driving circuit layer 12 of the present application may include more layers or less film layers, and the positional relationship of each film layer is not limited to that shown in this embodiment. For example, the gate 123 may also be positioned under the active layer 121 to form a bottom gate structure.

The first electrodes 20 are arranged in an array and disposed on the planarization layer 127. Each of the first electrodes 20 is connected to the source 1251 or the drain 1252 through the planarization layer 127 and the via hole of the passivation layer 126. The present application takes the connection between the first electrode 20 and the drain 1252 as an example for illustration.

Optionally, the first electrode 20 may be a transparent electrode or a reflective electrode. If the first electrode 20 is a transparent electrode, the first electrode 20 may be formed of, for example, indium tin oxide (ITO), indium zinc oxide (IZO), ZnO, or $In_2O_3$. If the first electrode 20 is a reflective electrode, the first electrode 20 may include, for example, a reflective layer formed of Ag, Mg, Al, Pt, Pd, Au, Ni, Nd, Ir, Cr, or a combination thereof, and a layer formed of ITO, IZO, ZnO or $In_2O_3$. However, the first electrode 20 is not limited thereto, and the first electrode 20 may be formed of various materials, and may also be formed in a single-layer or multi-layer structure.

The pixel definition layer 30 covers the first electrode 20 and the planarization layer 127, and the pixel definition layer 30 is patterned to form pixel openings 300. Each of the pixel openings 300 corresponds to one of the first electrodes 20 and exposes a portion of the first electrodes 20 to define a light-emitting area.

The light-emitting layer 40 is disposed in the pixel opening 300 and covers the first electrode 20 in the pixel opening 300. The light-emitting layer 40 is formed by printing light-emitting materials of different colors in the pixel opening 300. In detail, luminescent materials of different colors are dissolved in different organic solvents to form inks of different colors. Then, inks of different colors are respectively printed in different pixel openings 300 by means of inkjet printing or other processes to form the light-emitting layer 40. Luminescent materials of different colors emit light of different colors, for example, red luminescent materials emit red light, green luminescent materials emit green light, and blue luminescent materials emit blue light.

The light-reflecting layer 50 is disposed on the first surface of the pixel definition layer 30 in the pixel opening 300 and is located between the pixel definition layer 30 and the light-emitting layer 40. The first surface refers to the surface of the pixel definition layer 30 exposed by the pixel opening 300 after the pixel opening 300 is defined on the pixel definition layer 30. The angle between the first surface and the first electrode 20 exposed by the pixel opening 300 is greater than 90 degrees so that the cross-section of the pixel opening 300 is an inverted trapezoid. The light-reflecting layer 50 can reflect the light emitted from the light-emitting layer 40 to the pixel definition layer 30 so that the light emitted by the light-emitting layer 40 is concentrated in the middle, which improves the light utilization rate of the light-emitting layer 40. Further, the technical problem of low luminous utilization efficiency of light-emitting pixels in the current OLED structure is solved.

In detail, the material of the light-reflecting layer 50 includes a metal-polymer nanocomposite. For example, the material of the light-reflecting layer 50 is a metal-polymer nanocomposite formed by metals such as silver or chromium. The metal-polymer nanocomposite and the luminescent material are dissolved together in an organic solvent to form an ink. Then, the ink is printed in the pixel opening 300 by a process such as inkjet printing, and the ink in the pixel opening 300 is dried so that the luminescent material forms the light-emitting layer 40. The organic molecular segments of the polymer molecules of the metal-polymer nanocomposite are similar to the material structure of the pixel definition layer 30 so that the metal-polymer nanocomposite relies on intermolecular force or hydrogen bonding force, and during the heating and volatilization process of the organic solution, it moves to the first surface and is attached to the first surface to form the light-reflecting layer 50, as shown in FIG. 1.

It can be understood that, in order to enable the light-emitting layer 40 emit light, the display panel 100 further includes a second electrode 60 disposed on the light-emitting layer 40 and the pixel definition layer 30. The light-emitting layer 40 emits light under the combined action of the first electrode 20 and the second electrode 60, and the light-emitting layers 40 of different colors emit light of different colors, thereby realizing the full-color display of the display panel 100. Optionally, the first electrode 20 is an anode, and the second electrode 60 is a cathode. However, the present application is not limited to this.

Optionally, in order to improve the transmittance of light, the second electrode 60 is formed of a transparent conductive material. For example, the second electrode 60 may be formed of a transparent conductive oxide (TCO) such as ITO, IZO, ZnO, or $In_2O_3$.

Alternatively, the display panel 100 may further include a hole injection layer (HIL) and a hole transport layer (HTL) disposed between the light-emitting layer 40 and the first electrode 20, and an electron injection layer (EIL) and an electron transport layer (ETL) disposed between the light-emitting layer 40 and the second electrode 60. The hole injection layer receives the holes transmitted by the first electrode 20, the holes are transmitted to the light-emitting layer 40 via the hole transport layer, the electron injection layer receives electrons transmitted by the second electrode 60, and the electrons are transported to the light-emitting layer 40 via the electron transport layer. The holes and electrons combine at the position of the light-emitting layer 40 to generate excitons, and the excitons transition from the excited state to the ground state to release energy and emit light.

Furthermore, in order to protect the light-emitting layer 40 and prevent the light-emitting layer 40 from invading due to water and oxygen intrusion, the display panel 100 further includes an encapsulation layer 70 disposed on the second electrode 60. Optionally, the encapsulation layer 70 can be encapsulated by a thin film. For example, the encapsulation layer 70 can be a laminated structure formed by successively stacking three films of a first inorganic encapsulation layer, an organic encapsulation layer, and a second inorganic encapsulation layer. The encapsulation layer 70 can be formed by more layered structures.

Figure 2:
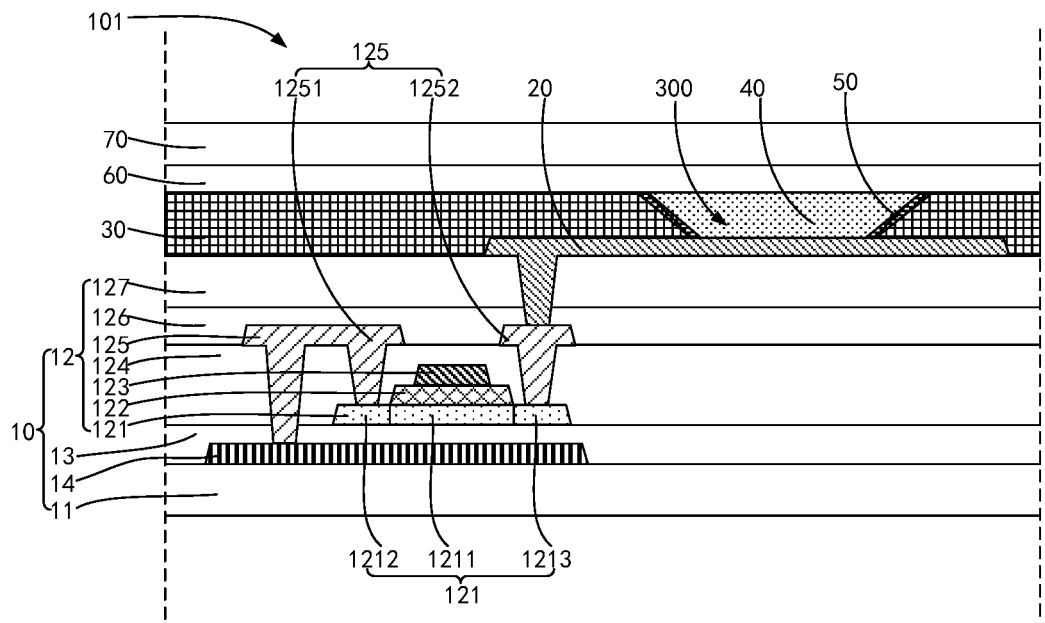
FIG. 2 is another schematic cross-sectional view of a display panel provided by an embodiment of the present application.

In an embodiment, please refer to FIG. 2, which is another schematic cross-sectional view of a display panel provided by an embodiment of the present application. Different from the aforesaid embodiment, in the display panel 101, the material of the light-reflecting layer 50 includes materials with light-reflecting functions, such as silver and chrome. After the pixel opening 300 is defined on the pixel definition layer 30, a thin film such as silver or chromium is coated on the first surface of the pixel definition layer 30 in the pixel opening 300 to form the light-reflecting layer 50, as shown in FIG. 2. For other descriptions, please refer to the aforesaid embodiments, which will not be repeated herein.

In an embodiment, please refer to FIG. 3, which is still another schematic cross-sectional view of a display panel provided by an embodiment of the present application. Different from the aforesaid embodiment, the light-reflecting layer 50 of the display panel 102 has a convex-concave microstructure, which can increase the reflection area of the interface. Furthermore, the light irradiated on the light-reflecting layer 50 is reflected more so that the light emitted by the light-emitting layer 40 is moved toward the middle, and the light utilization rate of the light-emitting layer 40 is improved. Therefore, the technical problem of low luminous utilization efficiency of light-emitting pixels in the current OLED structure is solved.

Optionally, after the pixel opening 300 is defined on the pixel definition layer 30, surface modification is performed on the pixel definition layer exposed by the pixel openings to increase the ability of diffuse reflection or total reflection there, thereby forming the light-reflecting layer 50 having a convex-concave microstructure. The ways of surface modification include plasma surface flocking, plasma ion implantation, surface roughness improvement, or the like. For other descriptions, please refer to the aforesaid embodiments, which will not be repeated herein.

In one embodiment, the present application further provides a manufacturing method of a display panel. Please refer to FIG. 1 to FIG. 4. FIG. 4 is a schematic flowchart of a manufacturing method of a display panel according to an embodiment of the present application. The manufacturing method of the display panel includes the following steps: S301:

Providing a substrate 10, and forming a first electrode 20 on the substrate 10. In detail, a substrate 11 is provided, a light-shielding layer 14 is formed on the substrate 11, the buffer layer 13 is covered on the light-shielding layer 14 and the substrate 11, the driving circuit layer 12 is formed on the buffer layer 13, and the first electrode 20 is formed on the driving circuit layer 12.

In detail, the driving circuit layer 12 includes an active layer 121, a gate insulating layer 122, a gate 123, an interlayer insulating layer 124, a source/drain layer 125, a passivation layer 126, and a planarization layer 127 which are sequentially stacked on the buffer layer 13. The active layer 121 includes a channel region 1211 and a source region 1212 and a drain region 1213 positioned on both sides of the channel region 1211. The gate insulating layer 122 covers the active layer 121 and is disposed corresponding to the channel region 1211. The gate 123 is disposed on the gate insulating layer 122 and corresponding to the channel region 1211.

The light-shielding layer 14 is disposed corresponding to the active layer 121 so that the orthographic projection of the active layer 121 on the substrate 11 falls within the orthographic projection range of the light-shielding layer 14 on the substrate 11. That is, the light-shielding layer 14 can completely shield the active layer 121 to prevent light from irradiating the active layer 121.

The interlayer insulating layer 124 covers the gate 123 and the buffer layer 13, and the source/drain layer 125 is disposed on the interlayer insulating layer 124. The source/drain layers 125 is patterned to form a source 1251 and a drain 1252, etc. The source 1251 is connected to the source region 1212 through a via hole of the interlayer insulating layer 124, and the drain 1252 is connected to the drain region 1213 through another via hole of the interlayer insulating layer 124. Optionally, the source 1251 is further connected to the light-shielding layer 14 through still another via hole of the interlayer insulating layer 124.

The passivation layer 126 covers the source/drain layer 125 and the interlayer insulating layer 124, and the planarization layer 127 covers the passivation layer 126. The arrangement of the planarization layer 127 can provide a flat film surface for the substrate 10.

The first electrodes 20 are arranged in an array and disposed on the planarization layer 127. Each of the first electrodes 20 is connected to the source 1251 or the drain 1252 through the via holes of the planarization layer 127 and the passivation layer 126. The present application takes the connection between the first electrode 20 and the drain 1252 as an example for illustration.

S302: Forming a pixel definition layer 30 on the first electrode 20 and the substrate 10, and patterning the pixel definition layer 30 to define pixel openings 300, wherein each of the pixel openings 300 exposes a portion of the first electrode 20.

In detail, the pixel definition layer 30 covers the first electrode 20 and the planarization layer 127, and the pixel definition layer 30 is patterned to form pixel openings 300. Each of the pixel openings 300 corresponds to one of the first electrodes 20 and exposes a portion of the first electrodes 20 to define a light-emitting area.

S303: Forming a light-emitting layer 40 and a light-reflecting layer 50 in the pixel openings 300, wherein the light-reflecting layer 50 covers a first surface of the pixel definition layer 30 in the pixel openings 300 and is located between the pixel definition layer 30 and the light-emitting layer 40.

In detail, in an embodiment, the step of forming the light-emitting layer 40 and the light-reflecting layer 50 in the pixel openings 300 includes: dissolving a metal-polymer nanocomposite and a luminescent material in an organic solvent to form an ink, printing the ink within the pixel openings 300, drying the ink in the pixel openings 300 to cause the luminescent material to form the light-emitting layer 40 and cause the metal-polymer nanocomposite to attach to a first surface of the pixel definition layer 30 in the pixel openings 300 to form the light-reflecting layer 50.

Further more, the metal-polymer nanocomposite is dissolved together with the luminescent material in an organic solvent to form an ink. Then, the ink is printed in the pixel opening 300 by a process such as inkjet printing, and the ink in the pixel opening 300 is dried so that the luminescent material forms the light-emitting layer 40. Since the organic molecular segments of the polymer molecules of the metal-polymer nanocomposite are similar to the material structure of the pixel definition layer 30, the metal-polymer nanocomposite relies on intermolecular force or hydrogen bonding force, and during the heating and volatilization process of the organic solution, it moves to the first surface and is attached to the first surface to form the light-reflecting layer 50, as shown in FIG. 1. The angle between the first surface and the first electrode 20 exposed by the pixel opening 300 is greater than 90 degrees so that the cross-section of the pixel opening 300 forms an inverted trapezoid.

In one embodiment, the step of forming the light-emitting layer 40 and the light-reflecting layer 50 in the pixel openings 300 includes: performing surface modification on a surface of the pixel definition layer 30 in the pixel openings 300 to form a convex-concave microstructure as the light-emitting layer 40, dissolving a luminescent material in an organic solvent to form an ink, and forming the light-emitting layer 40 by printing the ink in the pixel openings 300.

In detail, after the pixel opening 300 is defined on the pixel definition layer 30, surface modification is performed on the pixel definition layer 30 exposed by the pixel openings 300 to increase the ability of diffuse reflection or total reflection there, thereby forming the light-reflecting layer 50 having a convex-concave microstructure, as shown in FIG. 2. The ways of surface modification include plasma surface flocking, plasma ion implantation, surface roughness improvement, and the like.

In one embodiment, the step of forming the light-emitting layer 40 and the light-reflecting layer 50 in the pixel openings 300 includes: coating a layer of silver or chromium metal film on a surface of the pixel definition layer 30 in the pixel openings 300 as the light-reflecting layer 50, as shown in FIG. 2, dissolving a luminescent material in an organic solvent to form an ink, and forming the light-emitting layer 40 by printing the ink in the pixel opening 300.

Based on the same inventive concept, the present application further provides an electronic device including the display panel of one of the foregoing embodiments. The electronic device may be a display product such as a mobile phone, a television, or a wearable electronic device.

The present application provides a display panel, a manufacturing method thereof, and an electronic device. The display panel includes a substrate, a first electrode, a pixel definition layer, a light-emitting layer, and a light-reflecting layer. The first electrodes are arranged in an array and disposed on the substrate. The pixel definition layer covers the first electrodes and the substrate, wherein the pixel definition layer is defined with pixel openings, and each pixel opening exposes a portion of one of the first electrodes. The light-emitting layer is disposed in the pixel openings and covers the first electrodes. The light-reflecting layer is disposed on the first surface of the pixel definition layer in the pixel openings and located between the pixel definition layer and the light-emitting layer. In the present application, a light-reflecting layer is arranged in the pixel opening, and the light-reflecting layer can reflect the light emitted by the light-emitting layer to the pixel definition layer so that the light emitted by the light-emitting layer is concentrated in the middle, which improves the light utilization rate of the light-emitting layer. Therefore, the technical problem of low luminous utilization efficiency of light-emitting pixels in the current OLED structure is solved.

In the aforesaid embodiments, the description of each embodiment has its own emphasis. For parts that are not described in detail in a certain embodiment, reference may be made to the relevant descriptions of other embodiments.

The embodiments of the present application are described in detail above, and specific examples are used in this article to illustrate the principles and implementation of the present application. The description of the embodiments is to help understand the technical solutions and core ideas of the present application. Those of ordinary skill in the art should understand that it is possible to modify the technical solutions described in the embodiments, or equivalently replace some of the technical features. These modifications or replacements do not cause the essence of the corresponding technical solutions to deviate from the scope of the technical solutions of the embodiments of the present application.

What is claimed is:

1. A display panel, comprising:
a substrate;
first electrodes arranged in an array and disposed on the substrate;
a pixel definition layer covering the first electrodes and the substrate, wherein the pixel definition layer is defined with pixel openings, and each pixel opening exposes a portion of one of the first electrodes;
light-emitting layers disposed in the pixel openings and covering the first electrodes; and
light-reflecting layers disposed on a first surface of the pixel definition layer in one of the pixel openings and located between the pixel definition layer and one of the light-emitting layers;

wherein a material of the light-reflecting layers comprises a metal-polymer nanocomposite, organic molecular segments of polymer molecules of the metal-polymer nanocomposite are similar to a material structure of the pixel definition layer, allowing the metal-polymer nanocomposite relying on intermolecular force or hydrogen bonding force with the pixel definition layer to attach to the first surface to form the light-reflecting layers.

2. The display panel of claim 1, wherein a material of the light-reflecting layers comprises silver or chromium.

3. The display panel of claim 1, wherein an angle included between the first surface and the first electrode exposed by one of the pixel openings is greater than 90 degrees.

4. The display panel of claim 1, wherein the substrate comprises:
a base;
a light-shielding layer disposed on the base; and
a driving circuit layer disposed on a side of the light-shielding layer away from the base and comprising an active layer, a gate insulating layer, a gate, an interlayer insulating layer, and a source/drain layer arranged in a stack,
wherein the source/drain layer comprises a source and a drain, and the source or the drain is connected to the light-shielding layer.

5. The display panel of claim 1, wherein a material of the light-emitting layers comprises a luminescent material, and the metal-polymer nanocomposite is configured to be dissolved together with the luminescent material in an organic solvent to form an ink, the ink is printed in the pixel openings, and the ink within the pixel openings is dried to cause the luminescent material to form the light-emitting layers and cause the metal-polymer nanocomposite to attach to the first surface of the pixel definition layer in the pixel openings to form the light-reflecting layers.

6. A manufacturing method of a display panel, comprising:
providing a substrate and forming first electrodes on the substrate;
forming a pixel definition layer on the first electrodes and the substrate, and patterning the pixel definition layer to define pixel openings, wherein each of the pixel openings exposes a portion of one of the first electrodes;
forming light-emitting layers and light-reflecting layers in the pixel openings, wherein each light-reflecting layer covers a first surface of the pixel definition layer in one of the pixel openings and is located between the pixel definition layer and one of the light-emitting layers;
wherein the step of forming the light-emitting layers and the light-reflecting layers in the pixel openings comprises:
dissolving a metal-polymer nanocomposite and a luminescent material in an organic solvent to form an ink;
printing the ink within the pixel openings;
drying the ink in the pixel openings to cause the luminescent material to form the light-emitting layers and cause the metal-polymer nanocomposite to attach to the first surfaces of the pixel definition layer in the pixel openings to form the light-reflecting layers.

7. The manufacturing method of the display panel of claim 6, wherein the step of providing the substrate and forming the first electrodes on the substrate comprises:
providing a base and forming light-shielding layers on the base, forming a buffer layer on the light-shielding layers and the base, forming driving circuit layers on the buffer layer, and
forming the first electrodes on the driving circuit layers.

8. The manufacturing method of the display panel of claim 7, wherein the step of forming the driving circuit layers on the buffer layer comprises:

forming active layers, gate insulating layers, gates, an interlayer insulating layer, and source/drain layers in sequence on the buffer layer, wherein each of the source/drain layers comprises a source and a drain, and the source or the drain is connected to the light-shielding layer.

9. The manufacturing method of the display panel of claim 6, wherein an angle including between the first surface and the first electrode exposed by one of the pixel openings is set to be greater than 90 degrees.

10. An electronic device comprising a display panel, wherein the display panel comprises:

a substrate;

first electrodes arranged in an array and disposed on the substrate;

a pixel definition layer covering the first electrodes and the substrate, wherein the pixel definition layer is defined with pixel openings, and each pixel opening exposes a portion of one of the first electrodes;

light-emitting layers disposed in the pixel openings and covering the first electrodes; and light-reflecting layers disposed on a first surface of the pixel definition layer in one of the pixel openings and located between the pixel definition layer and one of the light-emitting layers;

wherein a material of the light-reflecting layers comprises a metal-polymer nanocomposite, organic molecular segments of polymer molecules of the metal-polymer nanocomposite are similar to a material structure of the pixel definition layer, allowing the metal-polymer nanocomposite relying on intermolecular force or hydrogen bonding force with the pixel definition layer to attach to the first surface to form the light-reflecting layers.

11. The electronic device of claim 10, wherein a material of the light-reflecting layer comprises silver or chromium.

12. The electronic device of claim 10, wherein an angle included between the first surface and the first electrode exposed by one of the pixel openings is greater than 90 degrees.

13. The electronic device of claim 10, wherein the substrate comprises:

a base;

a light-shielding layer disposed on the base; and a driving circuit layer disposed on a side of the light-shielding layer away from the base, and comprising an active layer, a gate insulating layer, a gate, an interlayer insulating layer, and a source/drain layer arranged in a stack, wherein the source/drain layer comprises a source and a drain, and the source or the drain is connected to the light-shielding layer.

14. The electronic device of claim 10, wherein a material of the light-emitting layers comprises a luminescent material, and the metal-polymer nanocomposite is configured to be dissolved together with the luminescent material in an organic solvent to form an ink, the ink is printed in the pixel openings, and the ink within the pixel openings is dried to cause the luminescent material to form the light-emitting layers and cause the metal-polymer nanocomposite to attach to the first surface of the pixel definition layer in the pixel openings to form the light-reflecting layers.

* * * * *